United States Patent
Yu et al.

(10) Patent No.: US 9,437,739 B2
(45) Date of Patent: Sep. 6, 2016

(54) FINFET SEAL RING

(71) Applicant: Taiwan Semiconductor Manufacturing Company, LTD, Hsin-Chu (TW)

(72) Inventors: Tsung-Yuan Yu, Taipei (TW); Hsien-Wei Chen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 184 days.

(21) Appl. No.: 14/199,216

(22) Filed: Mar. 6, 2014

(65) Prior Publication Data

US 2015/0255593 A1    Sep. 10, 2015

(51) Int. Cl.
*H01L 27/088* (2006.01)
*H01L 29/78* (2006.01)
*H01L 21/8234* (2006.01)
*H01L 29/66* (2006.01)

(52) U.S. Cl.
CPC ..... *H01L 29/785* (2013.01); *H01L 21/823431* (2013.01); *H01L 21/823481* (2013.01); *H01L 29/6681* (2013.01)

(58) Field of Classification Search
CPC ........................ H01L 23/562; H01L 29/0619
See application file for complete search history.

(56) References Cited

U.S. PATENT DOCUMENTS

| | | | | |
|---|---|---|---|---|
| 2010/0078769 | A1* | 4/2010 | West | H01L 23/562 257/620 |
| 2012/0161231 | A1* | 6/2012 | Tamaki | H01L 24/05 257/335 |
| 2013/0164893 | A1* | 6/2013 | Romano | H01L 29/0619 438/192 |

FOREIGN PATENT DOCUMENTS

| | | |
|---|---|---|
| KR | 10-0814391 | 3/2008 |
| KR | 10-2012-0016001 | 2/2012 |

OTHER PUBLICATIONS

KR Office Action, Application No. 10-2014-0157144, dated Oct. 22, 2015, 9 pages w/translation.
KR Notice of Allowance, Application No. 10-2014-0157144, dated May 3, 2016, 3 pages w/translation.
CN Office Action, Application No. 2013163609 20130228, dated Mar. 15, 2016, 5 pages no translation.

* cited by examiner

*Primary Examiner* — John C Ingham
*Assistant Examiner* — Frederick B Hargrove
(74) *Attorney, Agent, or Firm* — Haynes and Boone, LLP

(57) ABSTRACT

A semiconductor device includes a first front-end-of-line (FEOL) seal ring on a substrate, the seal ring comprising ring-shaped fin-like structures, integrated circuitry formed on the substrate, the integrated circuitry being circumscribed by the first seal ring, an isolation zone between the seal ring and the integrated circuitry, the isolation zone comprising a set of fin structures, each fin structure facing a same direction.

20 Claims, 8 Drawing Sheets

US 9,437,739 B2

FINFET SEAL RING

BACKGROUND

In semiconductor technologies, a semiconductor wafer is processed through various fabrication steps to form integrated circuits. Typically, several circuits are formed onto the same semiconductor wafer. The wafer is then diced to cut out the circuits formed thereon.

To protect the circuitry from damage, a seal ring is formed around the circuitry. This seal ring is formed during fabrication of the many layers that comprise the circuit, including both the front-end-of-line (FEOL) processing and back-end-of-line processing (BEOL). The FEOL includes the actual components such as transistors, capacitors, diodes, and resistors that are formed onto the semiconductor substrate. The BEOL includes the metal layer interconnects and vias that provide routing to the components of the FEOL.

During BEOL processing, a solid metal layer is formed around the circuit to form part of the seal ring for that level. Similarly, during the FEOL processing, the portion of the seal ring on those levels is formed. In some cases, an isolation zone is formed between the seal ring and the circuitry. If the circuitry includes gate structures formed over fin structures, then the isolation zone will have dummy features that include dummy gates and dummy fin structures.

It is desirable to have a seal ring design and isolation zone design that can provide a high quality seal and not have adverse effects on the circuitry within the seal ring.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
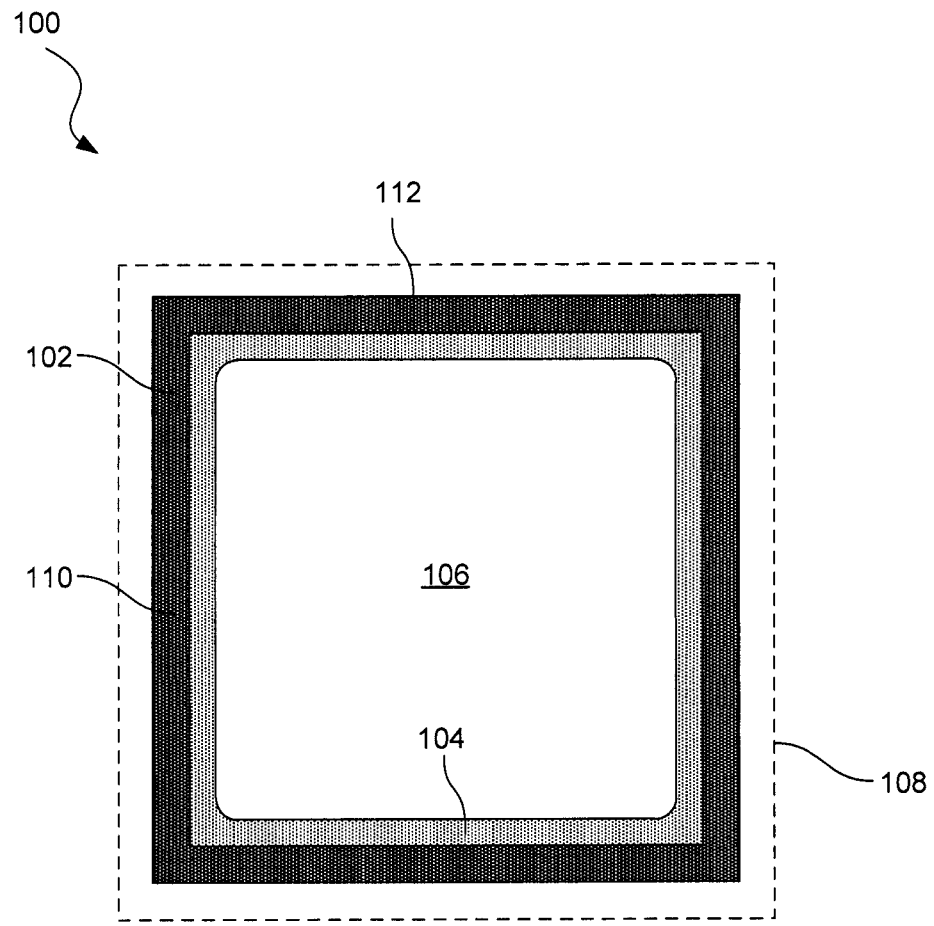
FIG. 1 is a diagram showing an illustrative top view of a seal ring, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As described above, it is desirable to have a seal ring design and an isolation zone design that can provide a high quality seal and not have adverse effects on the circuitry within the seal ring. A seal ring embodying principles described herein includes a seal ring formed on the front-end-of-line (FEOL) portion of a substrate. The seal ring surrounds the device components that form an integrated circuit. Between the device components and the seal ring is an isolation zone.

The isolation zone includes a set of dummy gate devices formed over fin structures. The dummy gate devices are formed in the same processes used to form the real gate devices for the integrated circuitry within the seal ring. Likewise, the fin structures of the isolation zone are formed during the same processes used to form the fin structures of the integrated circuitry. The fin structures of the isolation zone face the same direction no matter where along the seal ring they are positioned. For example, if the fin structures run parallel to a first edge of the seal ring, then the fin structures will run perpendicular to a second edge of the seal ring that is perpendicular to the first edge.

Maintaining a consistent fin direction throughout the isolation zone provides a larger process window. The improved process window can allow for more freedom to tune the photolithographic processes used to form the fin structures within both the isolation zone and the integrated circuitry.

FIG. 1 is a diagram showing an illustrative top view of a seal ring 102. According to the present example, a first seal ring 102 surrounds some integrated circuitry 106. An isolation zone 104 is formed between the integrated circuitry 106 and the first seal ring 102. In some examples, a second seal ring 108 may surround the first seal ring 102.

The integrated circuitry 106 includes the main device components such as resistors, capacitors, and transistors. These devices are formed onto the substrate using various methods. For example, a transistor may be formed by forming a gate device and doping the semiconductor substrate adjacent to the gate device. The integrated circuitry 106 within the seal ring 102 is designed to be its own chip that will be cut out of a semiconductor wafer.

The seal ring 102 is used to protect the integrated circuitry 106. Particularly, the seal ring 102 acts as a barrier to protect the integrated circuitry 106 when it is being cut out of the wafer. The seal ring 102 also prevents moisture or other contaminants from adversely affecting the integrated circuitry 106. The seal ring 102 is formed during fabrication of the FEOL components and the BEOL components. For example, when forming the metal interconnects of the BEOL, a metal ring is formed around the circuitry for each layer. Thus, the final seal ring is a result of multiple rings formed on individual layers. For the FEOL portion of the seal ring 102, the metal rings of the seal ring 102 are formed around the integrated circuitry 106. Additionally, as will be described in further detail below, fin structures and dummy gate structures are formed within the seal ring 102.

The seal ring 102 includes both vertical edges 110 and horizontal edges 112. These edges are referenced as vertical 110 and horizontal 112 for purposes of discussion. The references are meant to indicate relation to each other and not to some external point of reference.

The isolation zone 104 is formed between the integrated circuitry 106 and the first seal ring 102. The isolation zone 104 acts as a buffer between the walls of the seal ring and the device components of the integrated circuitry 106. As will be described in further detail below the isolation zone 104 comprises fin structures and dummy gate structures.

In some examples, there may be a second seal ring 108 that surrounds the first seal ring 102. The second seal ring 108 may provide additional protection for the integrated circuitry 106 within the first seal ring 102. The principles described herein may be implemented with any number of seal rings. While the corners of the seal ring 102 are shown as 90 degree angles, in some embodiments, the corners may be rounded or cut.

Figure 2A:
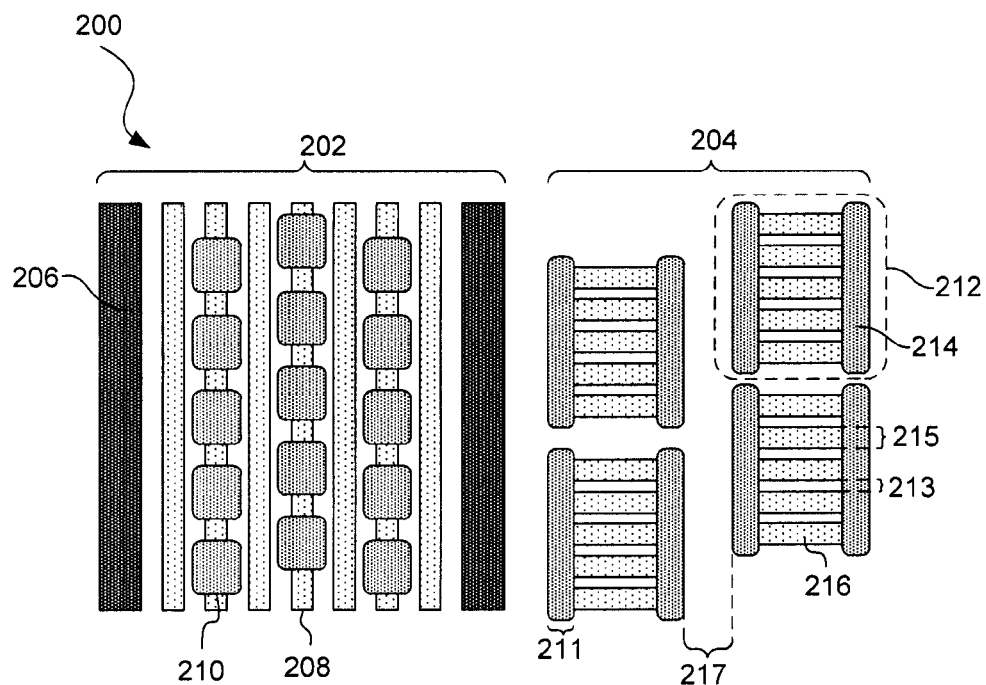
FIGS. 2A and 2B are diagrams showing an illustrative top view of a seal ring and isolation zone design, in accordance with some embodiments.
Figure 2B:
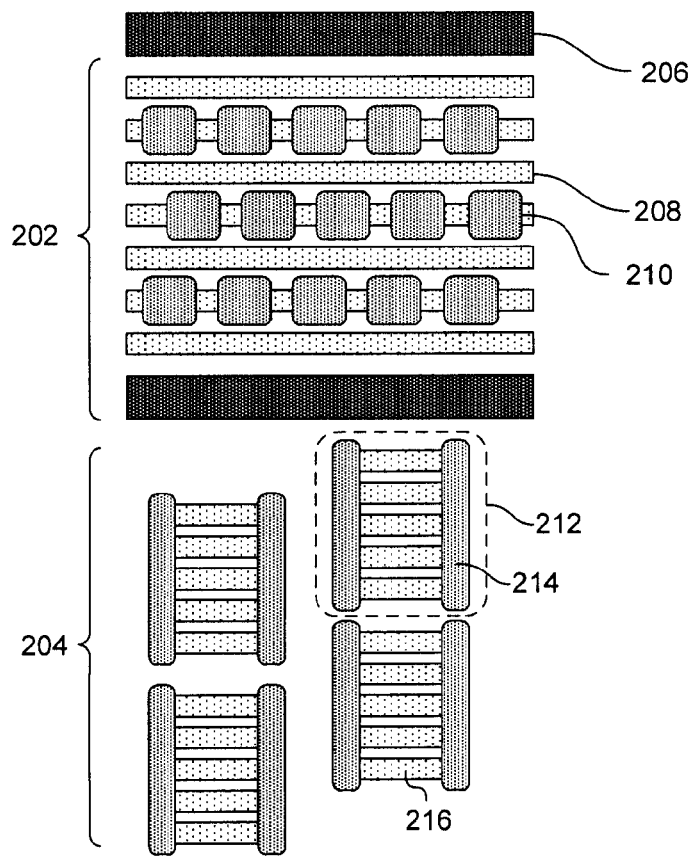

FIGS. 2A and 2B are diagrams showing an illustrative top view 200 of a seal ring and isolation zone design. FIG. 2A illustrates a top view of the FEOL portion of a seal ring and isolation zone along a vertical edge (e.g. 110, FIG. 1). The top view 200 shows a seal ring 202 and an isolation zone 204.

The seal ring 202 includes metal lines 206, fin-like structures 208, and dummy gate structures 210. The metal lines 206 are formed on both the inner portion of the seal ring and the outer portion of the seal ring. The metal lines 206 may circumscribe the integrated circuitry. In one example, the inner metal line may form one long loop around the integrated circuitry. The outer metal line may also form one long loop. The fin-like structures 208 are referred to as such because they are formed during the same process used to form the fin structures of finFET devices of the integrated circuitry. But, the fin-like structures form a ring rather than the type of fin structures used in finFET devices. The fin-like structures 208 include a semiconductor material, such as silicon or silicon germanium. The dummy gate structures 210 may be made of the same material used to form real gate structures within the integrated circuitry. For example, the dummy gate structures 210 may be made of polysilicon.

Each of the fin-like structures 208 may form a ring around the circumference of the seal ring 202. This helps isolate the circuitry on the inner side of the seal ring 202 to the environment that is external to the seal ring 202. The dummy gate structures 210 may be placed over the fin-like structures 208 in a variety of manners. In the present example, the dummy gate structures 210 are formed on every other one of the fin-like structures 208. Adjacent lines of dummy gate structures 210 may also be offset from each other. Various other patterns of dummy gate structures 210 formed over the fin-like structures 208 may be used in various embodiments.

As described above, some integrated circuits may have more than one seal ring. In such cases, each seal ring may be similar to the seal ring illustrated in FIG. 2A. Specifically, each of the seal rings may include a set of fin-like structures 208 that form a ring. Every other fin-like structure may have a line of dummy gate structures 210 formed thereon. In some cases, there may be a few fin-like structures 208 that form rings between the multiple seal rings. These fin-like structures 208 may or may not have dummy gate structures 210 formed thereon.

The isolation zone 204 may comprise a number of units 212. Each unit includes a set of fin structures 216. According to certain illustrative examples, the dummy gate structures 214 of the isolation zone are formed at the edges of the fin structures 216. The units 212 may also be placed in lines that form a ring near the inner portion of the seal ring 202. In some examples, and as illustrated in FIG. 2A, adjacent lines of units may be offset from each other. While only two lines of units are illustrated, it is contemplated that an isolation zone 204 may have more lines of units.

According to certain illustrative examples, the width 218 of each of the fin structures 216 may be within a range of about 0.048 and 0.14 microns. This width 215 may be equal to the width of the fin-like structures 208 within the seal ring. The distance 213 between fin structures 216 may be within a range of about 0.048 and 0.14 microns. This may be somewhat different than the space between the fin-like structures 208, which may be a range of about 0.14 to 0.4 microns. The width 211 of the dummy gate structures 214 may be within a range of about 0.1 and 0.4 microns. This may correspond to the width of the dummy gate structures 210 formed within the seal ring 202. The distance 217 between adjacent units 212 may be within a range of about 0.14 and 0.9 microns. The distance between the dummy gate structures 210 within the seal ring 202 and an adjacent fin-like structure 208 may be within a range of about 0.14 and 0.4 microns.

FIG. 2B illustrates a top view 200 of a seal ring 202 and isolation zone 204 along a horizontal edge (e.g. 112, FIG. 1). According to the present example, while the fin-like structures 208 between the two metal lines 206 of the seal ring 202 are facing a different direction to match the direction of the seal ring 202 on this edge, the units 212 of the isolation zone face the same direction. Specifically, the fin structures 216 are now parallel to the edge of the seal ring 202 rather than being perpendicular to the seal ring 202. Thus, no matter where along the seal ring 202 the units 212 of the isolation zone 204 are placed, the fin structures 216 face the same direction.

The fin structures 216 of the isolation zone 204 and the fin-like structures 208 of the seal ring 202 may be formed during the same process used to form fin structures for finFET (fin Field Effect Transistor) devices of the integrated circuitry (e.g. 106, FIG. 1). Such fin structures may be used to provide a better connection between a doped substrate and a gate device. Specifically, fin structures made of a doped semiconductor may be formed on the doped substrate. The gate device may then be formed over those fin structures. The fin structures cause a greater area of contact between the semiconductor material and the gate material, thus leading to better device performance.

It may be efficient to form the structures of the seal ring 202 and isolation zone 204 during the same process as the devices of the integrated circuitry. Specifically, the patterned masks used to form the circuitry can include the patterns for the seal ring 202 and isolation zone 204. Because all of the fin structures 216 of the isolation zones face the same direction, the process window is larger. This means that there is a greater range of tolerance for the settings of the tools used to form the fin structures. This allows for greater flexibility when setting process parameters for the integrated circuitry. In some examples, all fin structures used for finFET devices within the integrated circuitry also face the same direction as the fin structures within the isolation zone 204.

Additionally, the density of the dummy gate structures within the seal ring can be selected to match the average density of real gate structures within the integrated circuitry. This allows for a better Chemical Mechanical Polishing (CMP) process window. The CMP process is used to planarize the surface of a substrate. The CMP process involves a slurry with small particles. The size of the particles is selected based on the type of material to be polished. Thus, the CMP process can be tuned for a specific pattern density. If the pattern density of the dummy structures within the seal ring 202 is similar to the pattern density of real gate structures, then a larger CMP process window is provided.

As described above, in some embodiments, there may be more than one seal ring. In the case of the second seal ring, it may be patterned in a manner similar to the first seal ring illustrated in FIGS. 2A and 2B. Specifically, the second seal ring may have a set of ring-shaped fin-like structures that loop all the way around the seal ring. Additionally, a set of dummy gate structures may be formed in a pattern over the fin-like structures.

Figure 3A:
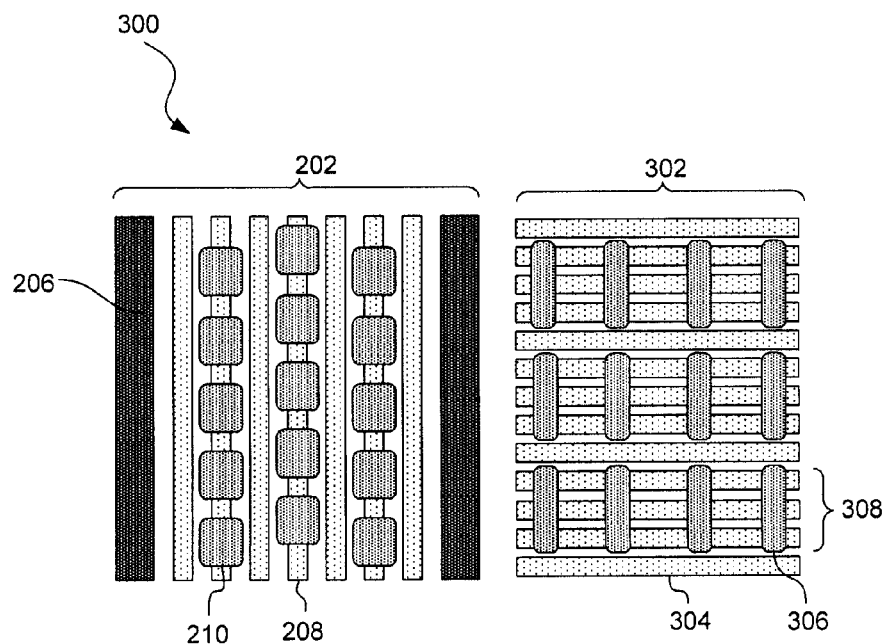
FIG. 3A is a diagram showing an illustrative top view of a seal ring and isolation zone design, in accordance with some embodiments.

FIG. 3A is a diagram showing an illustrative top view 300 of a seal ring 202 design and the isolation zone 302 design. According to the present example, the fin structures 304 of the isolation zone 302 may be grouped into sets 308. Each set 308 may have a number of fin structures 304 in parallel with each other. Additionally, each set may include a number of dummy gate structures 306. The dummy gate structures 306 are placed perpendicular to the fin structures. Additionally, the dummy gate structures 306 on the ends of the fin structures 304 may partially overlap the ends of the fin structures 304.

FIG. 3A illustrates the isolation zone 302 along a vertical portion of the seal ring 202. When the isolation zone 302 of FIG. 3A is adjacent to a horizontal portion of the seal ring 202, the fin structures 306 will remain in a horizontal position, while the fin-like structures 208 of the seal ring will instead be in a horizontal position rather than a vertical position.

Figure 3B:
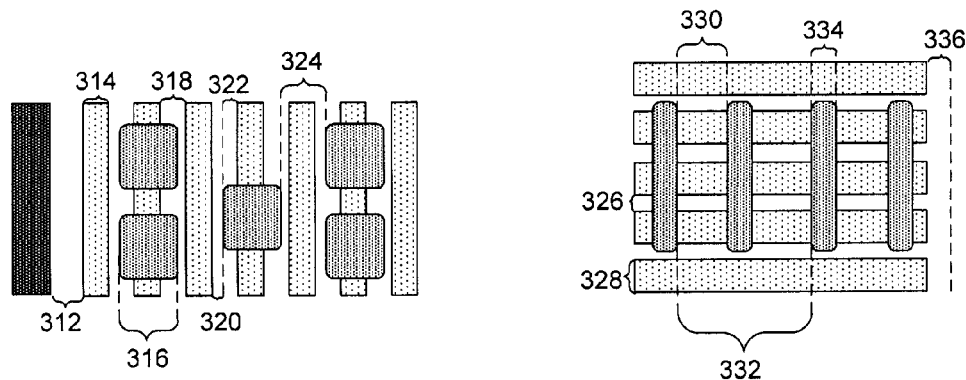
FIG. 3B is a diagram showing dimensions of the features illustrated in FIG. 3A, in accordance with some embodiments.

FIG. 3B is a diagram showing examples of various dimensions of the seal ring and isolation zone. According to the present example, the width 314 of the fin-like structures 208 of the seal ring 202 may be within a range of about 0.048 micron to about 0.14 micron. This may correspond with the width 328 of the fin structures 304 of the isolation zone 302. The width 316 of the dummy gate structures 210 of the seal ring 202 may be within a range of about 0.1 micron to about 0.4 micron. This may correspond to the width 334 of the dummy gate structures 306 of the isolation zone 302. The distance 326 between adjacent fin structures 304 may be within a range of about 0.048 micron to about 0.14 micron. But, the distance 318 between fin-like structures 208 within the seal ring 302 may be within a range of about 0.14 micron to about 0.4 micron. The distance 324 between dummy gate structures 210 on adjacent fin-like structures 208 having dummy gates formed thereon may be within a range of about 0.14 micron to 0.6 micron. The distance 332 between every other dummy gate structure 306 of the isolation zone 302 may be within a range of about 0.14 micron to about 0.9 micron.

The distance 320 between a dummy gate structure 210 and an adjacent fin-like structure 208 may be within a range of about 0.09 micron to about 0.4 micron. The distance 312 between a dummy gate structure 210 and the metal line 206 may be within a range of about 0.14 micron to about 0.4 micron. The distance 330 between adjacent dummy structures 306 of the isolation zone 302 may be within a range of about 0.065 micron to about 0.4 micron. The distance 336 between the end of a fin structure 304 of the isolation zone 302 and the edge of the isolation zone 302 may be within a range of about 0.036 micron to about 0.14 micron. The distance 322 between the edge of a fin-like structure 208 and the edge of a dummy gate structure 210 formed thereon may be within a range of about 0.05 micron to about 0.4 micron. The dimensions described with respect to the seal ring 202 of FIG. 3A may correspond to the dimensions of the seal ring 202 of FIGS. 2A and 2B.

Figure 4A:
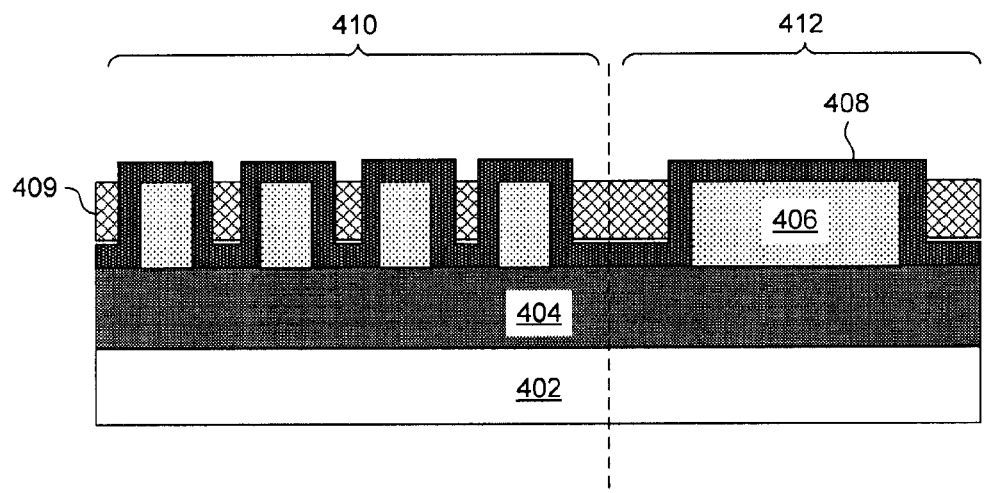
FIGS. 4A-4D are diagrams showing an illustrative process for forming a seal ring and corresponding isolation zone, in accordance with some embodiments.

FIGS. 4A-4D are diagrams showing an illustrative process for forming a seal ring and corresponding isolation zone. FIG. 4A illustrates the formation of features both within the seal ring 410 and the isolation zone. FIG. 4A is a cross section of the vertical edge (e.g. 110, FIG. 1). Thus, the fin structures of the isolation zone are perpendicular to the fin-like structures of the seal ring.

Referring to FIG. 4A, the substrate 402 may be a semiconductor substrate such as silicon 402. The semiconductor layer 404 is the layer that will ultimately form the fin structures. The semiconductor layer 104 may be grown on the substrate 402 by epitaxy growth. The semiconductor layer 104 may include a suitable semiconductor material, such as silicon, silicon germanium, or other suitable semiconductor material. A dielectric material layer (also referred to as a mandrel layer) 406 is deposited and patterned as a hard mask. The mandrel layer 406 is deposited onto the semiconductor layer 104 by a suitable process, such as chemical vapor deposition (CVD). The mandrel layer 406 is then patterned as illustrated. The patterning of the mandrel layer 406 may be done through standard photolithographic processing methods.

Still referred to FIG. 4A, another material layer 408 is formed on the patterned mandrel layer 404, and is substantially conformal to the top surface profile. Particularly, the material layer 408 is formed on the semiconductor layer 404 within the gaps of the mandrel layer and further formed on top of the mandrel layer 406 as well as the side walls of the mandrel layer 406. In some embodiments, the material layer 408 includes a bottom anti-reflective coating (BARC) layer or other suitable material. Additionally, a photoresist layer 409 is formed onto the BARC layer 408, such that the top portion of the material layer 408 is uncovered by the photoresist layer 409. This may be achieved by partially removing the top portion of the photoresist layer 409 or alternatively by tuning the spin coating process used to form the photoresist layer 409.

Figure 4B:
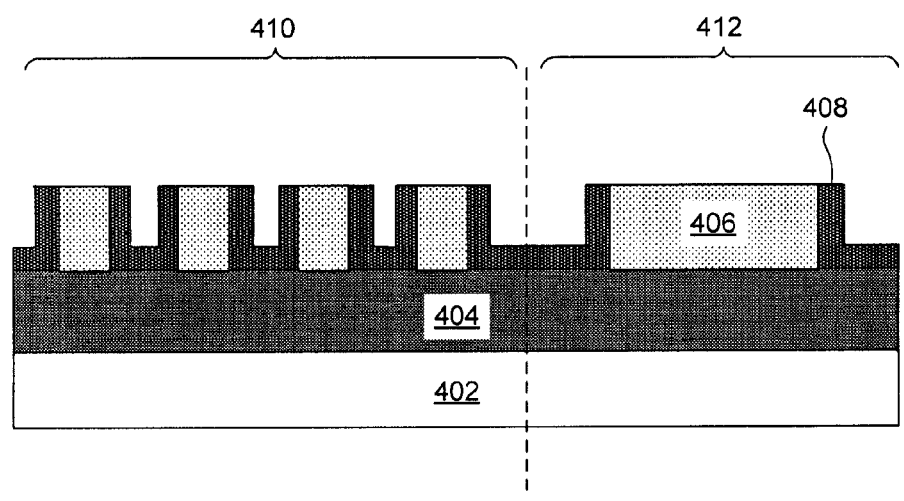

Referring to FIG. 4B, a top portion of the material layer 408 is removed by a suitable process, such as an etch process to selectively remove the material layer 408 uncovered by the photoresist layer 409 or alternatively a chemical mechanical polishing (CMP) process, to expose the mandrel features 406. This allows for removal of the mandrel layer 406. Thereafter, the photoresist layer 409 is removed by wet stripping or plasma ashing. The mandrel features 406 are then removed by a suitable process, such as selective etching. Specifically, an etching process that removes the mandrel material 406 but not the material layer 408 is used.

In some alternative embodiments, the material layer 408 includes a dielectric material different from that of the mandrel layer 406. The material layer 408 is deposited on the side walls and top of the mandrel layer 406, then is partially removed by anisotropic etch, such as dry etch, thereby forming spacers on sidewalls of the mandrel layer 406. Thus, the patterned material layer 408 defines the regions for fin-like active regions.

Figure 4C:
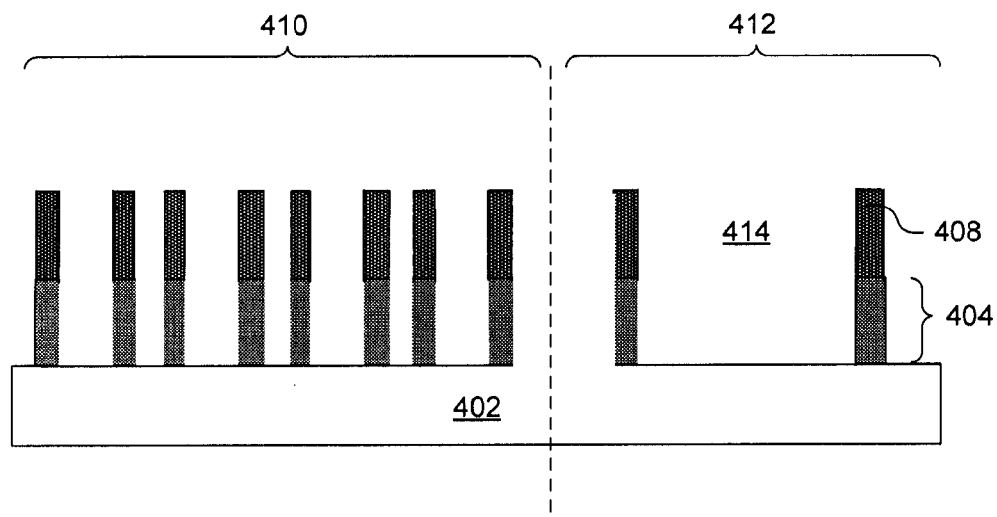

Referring to FIG. 4C, illustrates an etching process that removes part of the semiconductor layer 404. This etching may also be a selective etching that removes the semiconductor material 404 but not the material layer 408. After the etching process is complete, the material layer 408 can be removed.

Figure 4D:
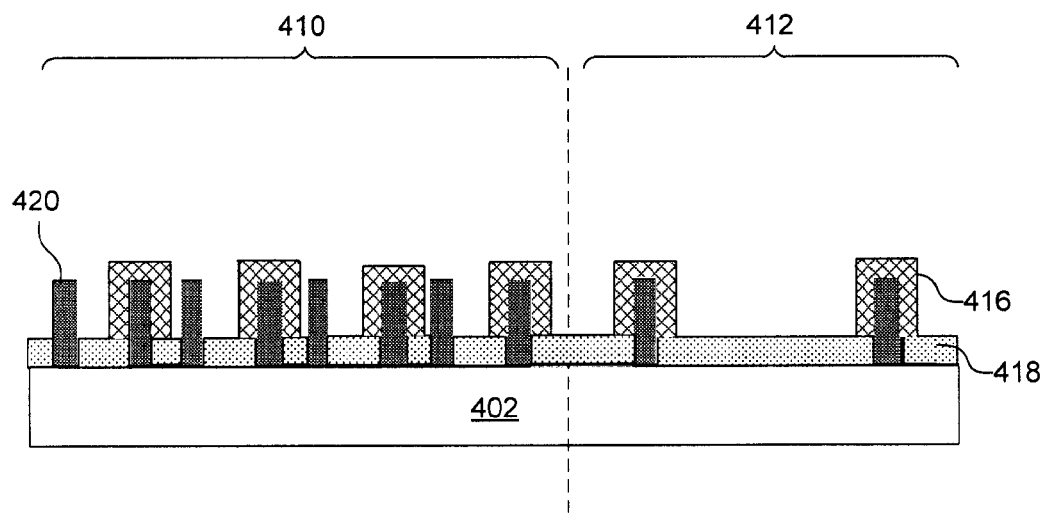

FIG. 4D illustrates the formation of a shallow trench isolation (STI) structure 418 as well as the dummy gate structures 416 over the fin structures 420. The STI structure 418 may be formed by a suitable procedure. In some embodiments, the STI structure 418 is formed by a procedure that includes deposition, CMP and etch-back. The dummy gate structures 416 are formed by a suitable procedure, such as a procedure that includes deposition and patterning. The patterning further includes lithography processes and etching. In some examples, the dummy gate structures 416 include a gate dielectric layer and a gate electrode layer disposed on the gate dielectric layer. The gate dielectric layer may include silicon oxide or other suitable dielectric material. The gate electrode layer may include polysilicon or other conductive material. It is noted that the features within FIGS. 4A-4D are not drawn to scale. Rather, the figures are used for illustrative purposes.

Figure 5A:
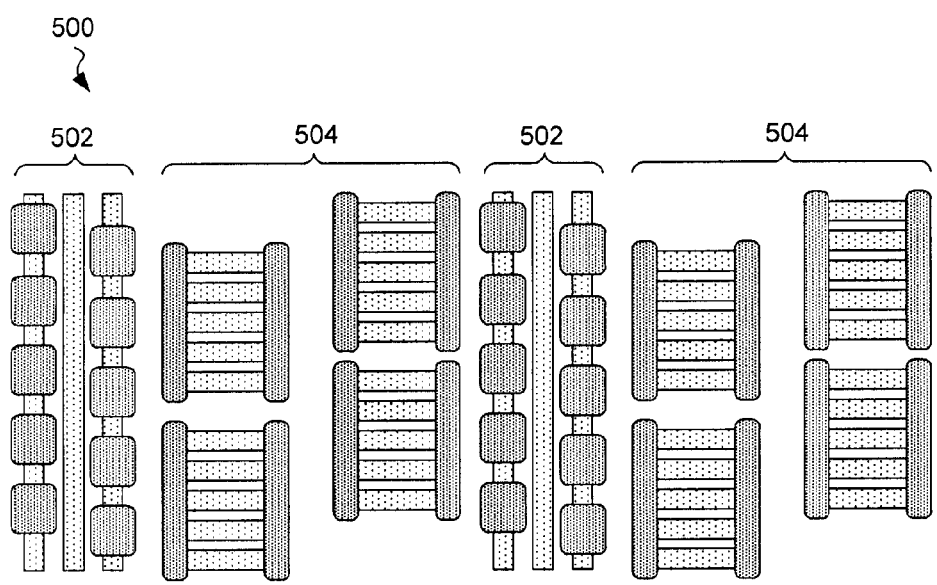
FIGS. 5A and 5B are diagrams showing an illustrative seal ring and isolation zone, in accordance with some embodiments.
Figure 5B:
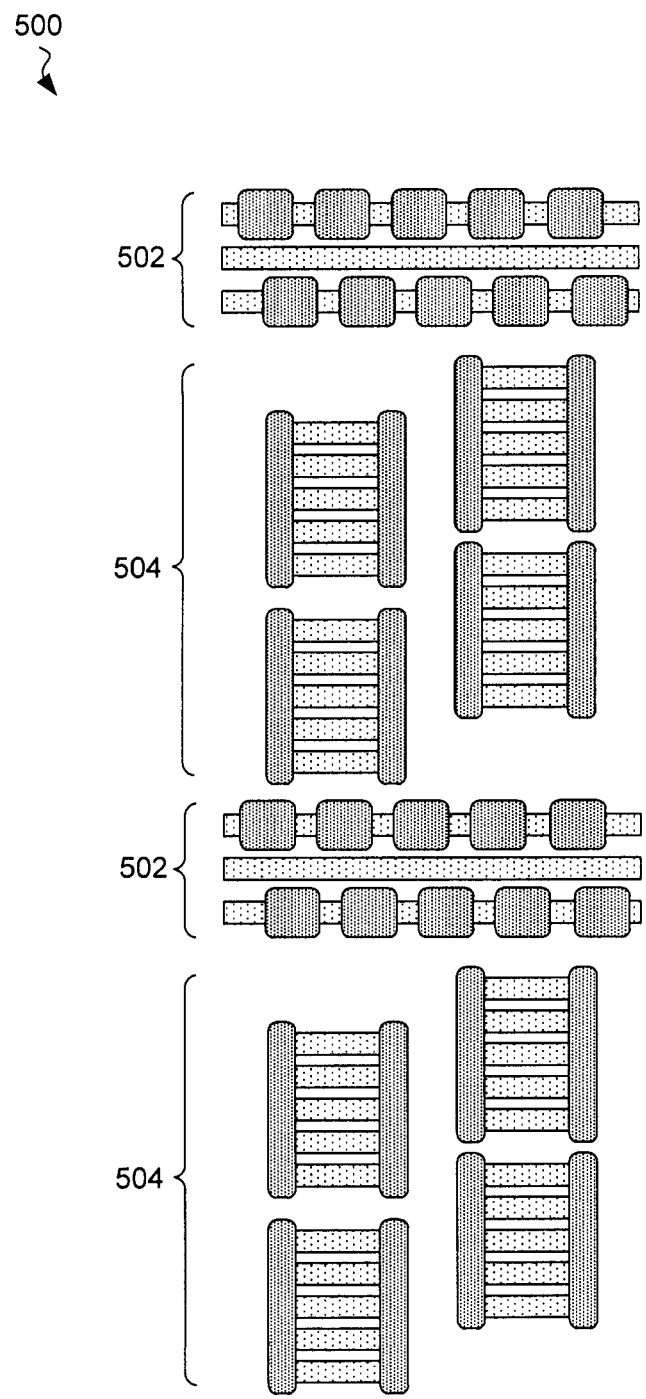

FIGS. 5A and 5B are diagrams showing an illustrative seal ring and isolation zone design 500. Specifically, the design 500 alternates between ring-shaped fin-like structures 502 and units 504 as illustrated in FIGS. 2A and 2B.

FIG. 5A illustrates the vertical portion of the seal ring sections 502. Particularly, the fin structures of the units 504 are perpendicular to the vertical portion of the seal ring sections 502.

FIG. 5B illustrates the horizontal portion of the seal ring sections 502. Particularly, the fin structures of the units 504 are parallel to the horizontal section of the seal ring sections 502. Thus, the fin structures of the units 504 face the same direction at different parts of the seal ring sections 502. While only two iterations of alternating are shown, various embodiments may include additional iterations. Furthermore, the units 504 may be of a different design. For example, the units 504 may instead have a design similar to that illustrated in FIG. 3A.

Figure 6:
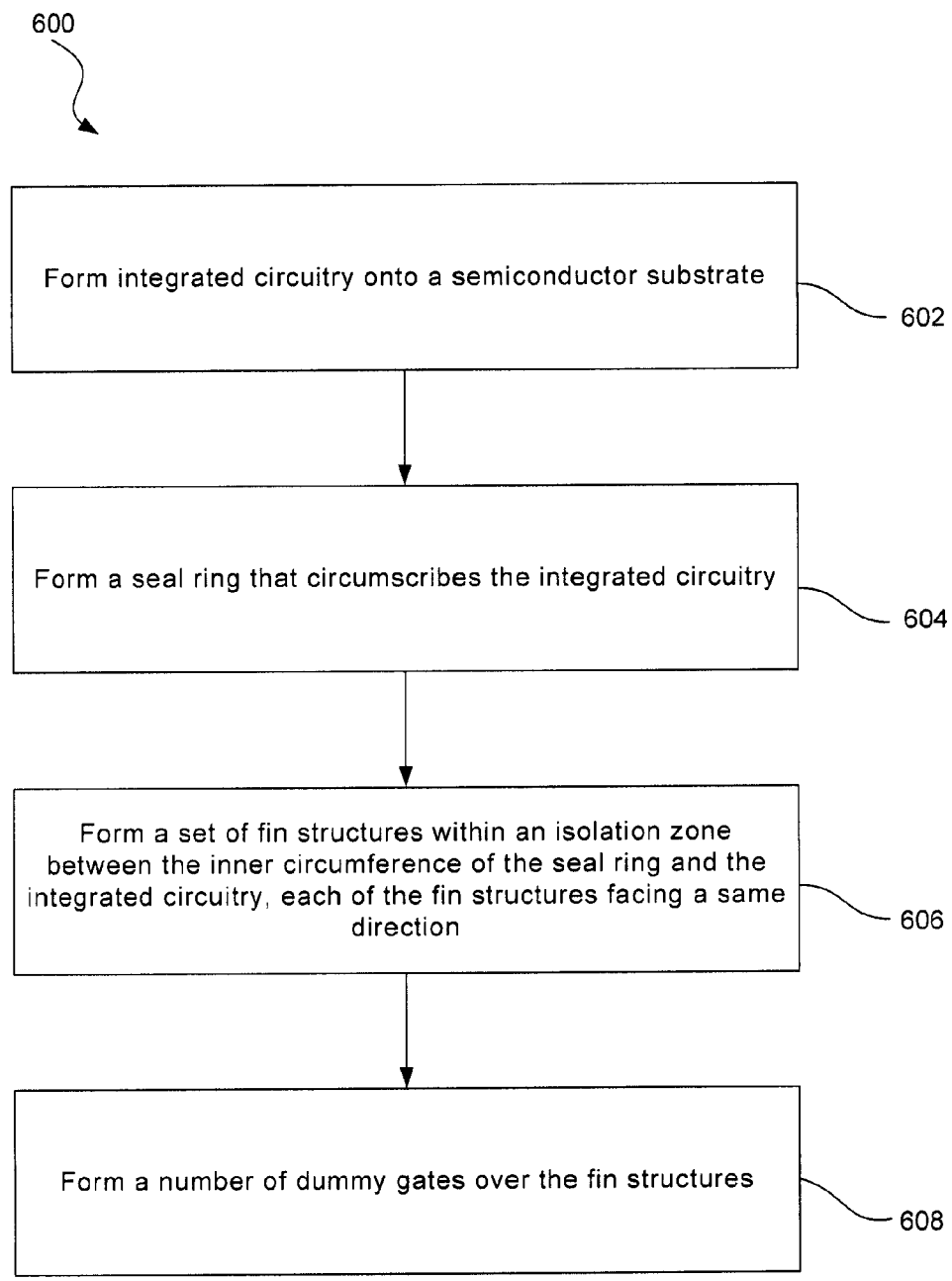
FIG. 6 is a flowchart showing an illustrative method for forming a seal ring and isolation zone, in accordance with some embodiments.

FIG. 6 is a flowchart showing an illustrative method for forming a seal ring and isolation zone. According to certain illustrative examples, the method 600 includes an operation 602 for forming integrated circuitry onto a semiconductor substrate. The integrated circuitry may include device components such as resistors and transistors. The transistors may include finFET devices that include a gate structure over a number of fin structures.

The method further includes an operation 604 for forming a seal ring that circumscribes the integrated circuitry. Thus, the seal ring may fully surround the integrated circuitry and act as a barrier to protect the integrated circuitry. The seal ring may be designed to protect the circuitry from cracking or breaking during the sawing process when the circuitry is cut out of the semiconductor wafer. The seal ring may also be designed to protect the integrated circuitry from moisture or other contaminants.

The method 600 further includes an operation 606 for forming a set of fin structures within an isolation zone between the inner circumference of the seal ring and the integrated circuitry, each of the fin structures facing a same direction. Thus, while the isolation zone may follow the inner circumference of the seal ring, the fin structures will always face the same direction. This allows for a larger process window when forming the units of the isolation zone. It is noted that the operations 502, 504 and 506 may be simultaneously implemented in a same processing flow.

The method 600 further includes an operation 608 for forming a number of dummy gates over the fin structures. The dummy gates may be formed perpendicular to the fin structures. In some examples, the dummy gates may be formed on the ends of units of fin structures. Thus, the dummy gate may partially overlap the ends of the fin structures.

According to one embodiment, a semiconductor device includes a first front-end-of-line (FEOL) seal ring on a substrate, the seal ring comprising ring-shaped fin-like structures, integrated circuitry formed on the substrate, the integrated circuitry being circumscribed by the first seal ring, an isolation zone between the seal ring and the integrated circuitry, the isolation zone comprising a set of fin structures, each fin structure facing a same direction.

According to one embodiment, an integrated circuit formed onto a semiconductor wafer includes front-end-of-line (FEOL) circuitry formed onto the wafer, a first seal ring circumscribing the circuitry, the seal ring comprising a plurality of concentric ring-shaped fin-like structures, and an isolation zone between the first seal ring and the circuitry, the isolation zone comprising a plurality of fin structure units formed along an inner circumference of the first seal ring, each fin structure unit comprising a series of fin structures facing a same direction, and at least one dummy gate formed over the fin structures. Each of the fin structures from each of the fin structure units faces the same direction.

According to one embodiment, a method for fabricating a semiconductor device includes forming integrated circuitry onto a semiconductor substrate, forming a seal ring that circumscribes the integrated circuitry, the seal ring comprising a set of concentric ring-shaped fin-like structures, forming a set of fin structures within an isolation zone between the inner circumference of the seal ring and the integrated circuitry, each of the fin structures facing a same direction, and forming a number of dummy gates over the fin structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a first front-end-of-line (FEOL) seal ring on a substrate, the first FEOL seal ring comprising ring-shaped fin-like structures;
   integrated circuitry formed on the substrate, the integrated circuitry being circumscribed by the first FEOL seal ring;

an isolation zone between the first FEOL seal ring and the integrated circuitry, the isolation zone comprising a set of fin structures, each fin structure facing a same direction;

wherein the first FEOL seal ring comprises an inner metal line and an outer metal line with a space between the inner metal line and outer metal line, the ring-shaped fin-like structures being within the space.

2. The semiconductor device of claim 1, further comprising, a dummy gate structure formed over the fin structures.

3. The semiconductor device of claim 2, wherein the fin structures within the isolation zone are grouped into units.

4. The semiconductor device of claim 3, wherein each unit comprises at least one dummy gate structure formed on an edge of the fin structures.

5. The semiconductor device of claim 2, wherein the dummy gate is formed on an end of the fin structures, the dummy gate structure extending past ends of the fin structures.

6. The semiconductor device of claim 3, wherein the units are positioned in rows, adjacent rows being offset from each other.

7. The semiconductor device of claim 1, further comprising dummy gate structures formed over the ring-shaped fin-like structures.

8. The semiconductor device of claim 1, further comprising, dummy gate structures formed over the fin structures, the dummy gates running perpendicular to the fin structures.

9. The semiconductor device of claim 1, further comprising, a second seal ring surrounding the first FEOL seal ring.

10. The semiconductor device of claim 1, wherein a width of the fin structures is substantially similar to a width of the ring-shaped fin-like structures within the seal ring.

11. An integrated circuit formed onto a semiconductor wafer, the integrated circuit comprising:
front-end-of-line (FEOL) circuitry formed onto the wafer;
a first seal ring circumscribing the FEOL circuitry, the seal ring comprising a plurality of concentric ring-shaped fin-like structures; and
an isolation zone between the first seal ring and the circuitry, the isolation zone comprising a plurality of fin structure units formed along an inner circumference of the first seal ring, each fin structure unit comprising:
a series of fin structures facing a same direction; and
at least one dummy gate formed over the fin structures;
wherein each of the fin structures from each of the fin structure units faces the same direction;
wherein the seal ring comprises an inner metal line and an outer metal line with a space between the inner metal line and outer metal line, the ring-shaped fin-like structures being within the space.

12. The semiconductor device of claim 11, further comprising:
dummy gate structures formed over the ring-shaped fin-like structures; and
a second seal ring surrounding the first seal ring, the second seal ring comprising concentric ring-shaped fin-like structures.

13. The semiconductor device of claim 12,
wherein a dimension of the fin-like structures is substantially similar to a dimension of the fin structures; and
wherein a dimension of the dummy gate structures within the seal ring is substantially similar to a dimension of the dummy gate structures within the isolation zone.

14. The semiconductor device of claim 11, wherein the isolation zone is about 4 to 8 micrometers wide.

15. A method for fabricating a semiconductor device, the method comprising:
forming integrated circuitry onto a semiconductor substrate;
forming a seal ring that circumscribes the integrated circuitry, the seal ring comprising a set of concentric ring-shaped fin-like structures;
forming a set of fin structures within an isolation zone between the inner circumference of the seal ring and the integrated circuitry, each of the fin structures facing a same direction; and
forming a number of dummy gates over the fin structures;
wherein the ring-shaped fin-like structures are between an outer metal line of the seal ring and an inner metal line of the seal ring.

16. The method of claim 15, further comprising, forming a second seal ring that circumscribes that first seal ring.

17. The method of claim 15, wherein the fin structures within the isolation zone are grouped into units.

18. The method of claim 17, wherein each unit comprises at least one dummy gate structure formed on an edge of the fin structures.

19. The method of claim 18, further comprising, forming the dummy gate on an end of the fin structures, the dummy gate structure extending past ends of the fin structures.

20. The method of claim 19, wherein the units are positioned in rows, adjacent rows being offset from each other.

* * * * *